(12) United States Patent  
Horch et al.

(10) Patent No.: US 9,406,812 B1  
(45) Date of Patent: Aug. 2, 2016

(54) ASYMMETRIC DENSE FLOATING GATE NONVOLATILE MEMORY WITH DECOUPLED CAPACITOR

(71) Applicant: Synopsys, Inc., Mountain View, CA (US)

(72) Inventors: Andrew E. Horch, Seattle, WA (US); Martin Luc Cecil Arthur Niset, Seattle, WA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/594,527

(22) Filed: Jan. 12, 2015

(51) Int. Cl.
| | |
|---|---|
| *H01L 29/792* | (2006.01) |
| *H01L 29/51* | (2006.01) |
| *H01L 29/45* | (2006.01) |
| *H01L 29/49* | (2006.01) |
| *H01L 29/417* | (2006.01) |
| *H01L 29/78* | (2006.01) |
| *H01L 29/66* | (2006.01) |
| *H01L 21/265* | (2006.01) |
| *H01L 21/28* | (2006.01) |

(52) U.S. Cl.
CPC ........ *H01L 29/792* (2013.01); *H01L 21/26513* (2013.01); *H01L 21/28282* (2013.01); *H01L 29/41758* (2013.01); *H01L 29/45* (2013.01); *H01L 29/4975* (2013.01); *H01L 29/513* (2013.01); *H01L 29/518* (2013.01); *H01L 29/665* (2013.01); *H01L 29/66575* (2013.01); *H01L 29/66659* (2013.01); *H01L 29/66833* (2013.01); *H01L 29/7835* (2013.01); *H01L 29/7836* (2013.01)

(58) Field of Classification Search
CPC . H01L 29/792; H01L 29/45; H01L 29/41758; H01L 29/7835; H01L 29/7836; H01L 29/66833; H01L 29/518; H01L 29/66575; H01L 21/26513; H01L 29/66659; H01L 29/665; H01L 29/4975; H01L 21/28282; H01L 29/513

See application file for complete search history.

(56) References Cited

U.S. PATENT DOCUMENTS

| | | | | |
|---|---|---|---|---|
| 5,969,383 | A * | 10/1999 | Chang | ............... H01L 21/28282 257/316 |
| 6,885,058 | B2 * | 4/2005 | Wils | ...................... H01L 27/115 257/316 |
| 8,168,529 | B2 | 5/2012 | Lin et al. | |
| 2002/0137290 | A1 * | 9/2002 | Wils | ...................... H01L 27/115 438/264 |

(Continued)

OTHER PUBLICATIONS

Chen, Y-J. et al., "A Novel 2-Bit/Cell P-Channel Logic Programmable Cell with Pure 90-nm CMOS Technology," IEEE Electron Device Letters, Aug. 2008, pp. 938-940, vol. 29, No. 8.

(Continued)

*Primary Examiner* — Victor A Mandala  
(74) *Attorney, Agent, or Firm* — Fenwick & West LLP

(57) ABSTRACT

A nonvolatile memory ("NVM") bitcell includes a source and a drain formed in an active region of a substrate and separated by a channel region in the active region. A gate stack formed over the substrate includes a gate formed on an oxide and at least one sidewall spacer formed around the gate. A charge trapping layer is formed on an opposite side of the sidewall spacer from the gate, where at least a portion of the charge trapping layer acts as a floating gate for the bitcell. The bitcell further includes a salicide block covering the floating gate portion of the charge trapping layer. An contact (sometimes referred to as a bar contact) physically contacts the salicide block above the floating gate portion of the charge trapping layer.

26 Claims, 11 Drawing Sheets

(56) References Cited

U.S. PATENT DOCUMENTS

| | | | | |
|---|---|---|---|---|
| 2008/0150007 | A1* | 6/2008 | Brennan | H01L 21/28282 257/324 |
| 2011/0175156 | A1* | 7/2011 | Okuyama | H01L 21/28282 257/324 |
| 2012/0132978 | A1* | 5/2012 | Toba | H01L 21/28282 257/316 |
| 2012/0292679 | A1* | 11/2012 | Funayama | H01L 21/28282 257/298 |
| 2013/0240977 | A1* | 9/2013 | Kaneoka | H01L 29/66833 257/325 |

OTHER PUBLICATIONS

Huang, C-E. et al., "A New CMOS Logic Anti-Fuse Cell with Programmable Contact," $22^{nd}$ IEEE Non-Volatile Semiconductor Memory Workshop, 2007, 4 pages.

Kono, T. et al., "40nm Embedded SG-MONOS Flash Macros for Automotive with 160MHz Random Access for Code and Endurance Over 10M Cycles for Data," ISSCC 2013, Session 12, Non-Volatile Memory Solutions, 12.2, 3 pages.

Lien, C-W. et al., "A New 2T Contact Coupling Gate MTP Memory in Fully CMOS Compatible Process," IEEE Transactions on Electron Devices, Jul. 2012, pp. 1899-1905, vol. 59, No. 7.

* cited by examiner

ASYMMETRIC DENSE FLOATING GATE NONVOLATILE MEMORY WITH DECOUPLED CAPACITOR

BACKGROUND

1. Field of Art

This disclosure generally relates to the field of nonvolatile memory, particularly nonvolatile memory bitcell layouts.

2. Description of the Related Art

Nonvolatile memory (NVM) refers to memory that persistently stores information bits when not powered. A nonvolatile memory bitcell (NVM bitcell) stores a single bit of data. Some types of NVM bitcells are implemented using transistors with floating gates. The amount of charge residing on a floating gate determines whether the bitcell is storing a logical "1" or a logical "0". The floating gate is referred to as "floating" because the gate is electrically isolated from the surroundings by an oxide or dielectric. Some NVM can store more than two states in the bitcell.

In order to expand applications and reduce costs of memory devices, it is desirable to accommodate a large number of bitcells in a given area. It is also desirable to decrease the cost of fabricating each bitcell by using standard complementary metal-oxide-semiconductor manufacturing processes ("CMOS processes"). Currently available memory devices include EEPROM and FLASH (and eFLASH), both of which have disadvantages. Currently, FLASH has a very small bitcell, but requires steps in addition to the standard CMOS process, which increases the cost of producing the bitcell and possibly changes the performance or characteristics of the produced devices. EEPROM is compatible with standard CMOS processes, but has a relatively large bitcell size, and thus is only suitable for low bit count memories.

SUMMARY

A nonvolatile memory ("NVM") bitcell includes a source and a drain formed in an active region of a substrate and separated by a channel region in the active region. A gate stack formed over the substrate includes a gate formed on an oxide and at least one sidewall spacer formed around the gate. A charge trapping layer is formed on an opposite side of the sidewall spacer from the gate, where at least a portion of the charge trapping layer acts as a floating gate for the bitcell. The bitcell further includes a salicide block covering the floating gate portion of the charge trapping layer. A contact (sometimes referred to as a bar contact) physically contacts the salicide block above the floating gate portion of the charge trapping layer.

DETAILED DESCRIPTION

Figure 1A:
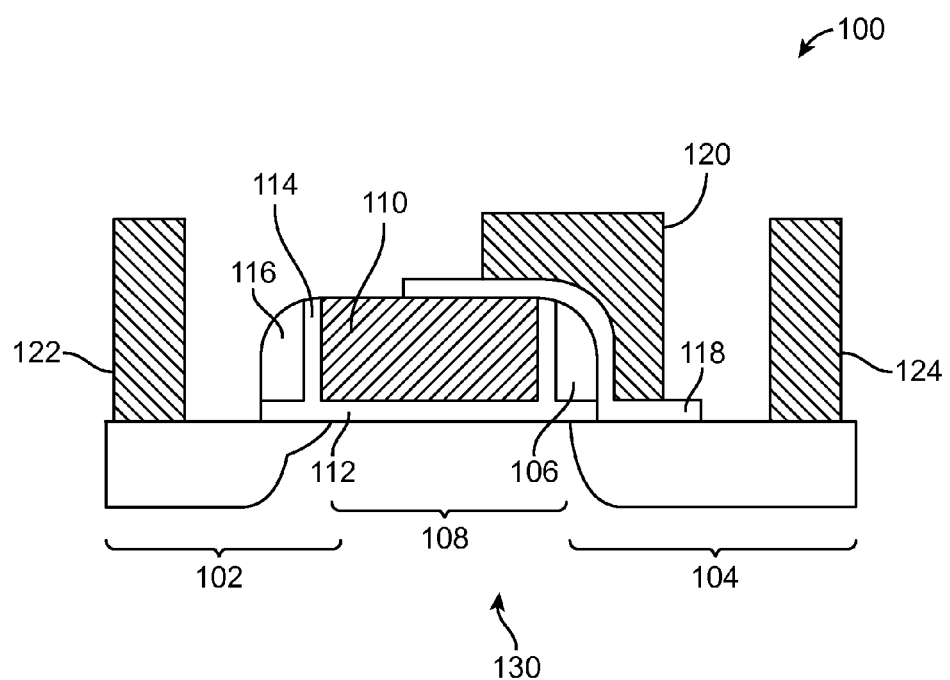
FIG. 1A is a cross sectional view of a NVM bitcell, according to one embodiment.

Embodiments relate to a high density nonvolatile memory ("NVM") bitcell (or bit, or bitcell). The NVM bitcell is advantageous to both existing FLASH, and EEPROM solutions. The NVM bitcell has a higher bitcell density than existing EEPROM bitcells. The NVM memory device achieves this higher density by using the bar contact (also known as a line contact) as a top plate capacitor above a dielectric material that can trap and store charge. This helps make the bitcell much smaller than existing EEPROM bitcells. Bar contact and bar vias are used in all CMOS logic chip in the die seal ring. The die seal ring is a continuous "wall" of metal used to prevent ions from diffusing into the die through the dielectric on the edge of the die.

A spacer is a dielectric region used to create a small gap between the source/drain regions of a CMOS transistor and the gate. In many advanced technologies (0.18 μm and below) the spacer is composed of both oxide and nitride. Nitride is a material that includes a lot of electron traps that can be used to store charge. This is the basis of SONOS memories. However, Silicon Oxide Nitride Oxide Silicon (SONOS) (and similarly Silicon Oxide Nitride Oxide Metal (SONOM)) memories typically include a SONOS stack including the gate oxide, which adds to the cost of the process.

A salicide block layer (or resist protect oxide (RPO)) is used to block the formation of silicon/metal materials. The silicon surface is salicided (metalized) to reduce its resistance and make transistor faster. However, some circuits require resistors to function as desired. The salicide block is added to allow the formation of higher resistive components (resistors). The salicide block also has the unintended feature that it prevents the contact from going all the way down to silicon.

By combining bar contacts, nitrides in spacers, and salicide blocks a NVM bitcell can be created using the standard CMOS process with no additional process steps that is much smaller than an EPROM bitcell. This NVM bitcell can be analogized to a highly modified SONOS/SONOM bitcell. A silicon substrate acts as the bottom silicon region. A poly sidewall oxide (which also ends up below the nitride in the space) is the lower oxide region. The nitride in the spacer is the nitride region. The salicide block material acts as the upper oxide region. The bar contact (metal) acts as the upper conductive region (upper silicon region). The poly gate becomes a select device during the read operation.

The NVM bitcell is further advantageous because the nitride floating gate can be programmed multiple times (referred to as a multiple time programmable bitcell or MTP), and is not just a one-time programmable bitcell or OTP. This is because existing bitcells that use the nitride layer adjacent to the sidewall spacer as a floating gate typically do not efficiently couple charge onto and off the nitride layer. As a result, to be effective they often are limited to OTP implementations that permanently affect the bitcell structure to program the bitcell. For example, they burn through the oxide separating the nitride from the active region when programming, preventing further program/erase iterations. Instead, because the NVM bitcell includes the bar contact as a top plate capacitor, it is able to more efficiently couples charge on and off a nitride floating gate, which allows MTP operation.

Single Gate NVM Bitcell with Bar Contact

FIG. 1A is a cross sectional view of a NVM bitcell, according to one embodiment. For illustrative purposes, the example bitcell 100 of FIG. 1 is a N-type metal-oxide-semiconductor field effect transistor (MOSFET). However, the bitcell 100 may also be implemented as P-type MOSFET.

The bitcell 100 includes a source 102 and a drain 104 in an active region 130 of a substrate. The source 102 is coupled to a source contact 122 and the drain 104 is coupled to a drain contact 124. Within the active region 130, the source 102 and drain 104 are separated by a channel region 108. An oxide 112 such as silicon dioxide ($SiO_2$) is formed on the substrate 130 above the channel region 108 between the source 102 and drain 104 as insulating material. On top of the oxide 112 is a gate 110. The gate is surrounded by sidewall spacers 114. On the other side of the spacers 114 from the gate 110 on top of the oxide 112 is a nitride ($Si_3N_4$) layer 116 functioning as a dielectric material. The nitride layer 116 may be divided up into multiple physically isolated portions depending upon the shape of the oxide 112, spacers 114, and gate 110 on top of the active region 130. A portion of the nitride layer 116 acts as the floating gate 106 of the bitcell where charge carriers are added and removed during program and erase operations.

A salicide block (also referred to as a salicide prevent or a RPO) 118 is formed in contact with at least a portion of the gate 110 and the drain 104 (illustrated). A salicide block is named as such because it prevents (or blocks) a salicide from forming. A salicide block may be made of a dielectric, such as nitride, or an oxide, such as silicon dioxide or some combination of the two. The salicide block 118 is also formed to fully cover the portion of the nitride layer 116 that makes up the floating gate 106. On top of the salicide block 118 is a bar contact 120. The bar contact 120 is sometimes also referred to as a bar vias, a line contact, or a non-square contact among those having skill in the art of the standard CMOS logic process.

The nitride layer 116 in the floating gate 106 is a partially trappy layer of material. Nitride has a tendency to trap charge. This makes it usable for storing charge, but since it is a dielectric it can be relatively difficult to force charge on and off the gate as compared to a conductive material such as polysilicon floating gates. A bitcell using the portion of the nitride layer 116 outside of the spacers 114 to store charge, such as in bitcell 100, typically uses channel hot electron injection (CHEI), channel initiated secondary electron injection (CHISEL), impact ionized hot election injection (IHEI), and/or band to band tunneling (BTBT) to program and erase the bitcell. With these effects, the direction of travel of electrons or holes is random. Thus, actually getting charge on and off the floating gate 106 can be highly inefficient absent some mechanism of controlling the direction of charge carriers.

The presence of the bar contact 120 on top of the salicide block 118 addresses this directionality problem. By applying a voltage to the bar contact 120 when programming and/or erasing is being performed, an electric field is created which draws charge into or out of the floating gate 106, depending upon the operation being performed. The bar contact 120 may also be referred to as a top plate of a capacitor, with the bottom plate being the gate 110 and/or channel region 108. In program or erase operations, the voltages on either plate of this capacitor serve to trap charge or polarize the floating gate 106 by adding or removing charge from it.

Advantages of including the bar contact 120 above the floating gate 106, include among others, dramatically increases the efficiency of programming or erasing the floating gate 106. It also removes the need for a separate capacitive portion of the floating gate 106 to exist elsewhere over the substrate (for example, in connection with another separate active region) to adjust the voltage of the floating gate 106 to assist in program and erase operations. As a result, bitcell 100 requires significantly less surface area on the substrate 130, allowing for increased memory density.

The source 102 and drain 104 may each include different dopings (or implants) of charge carriers from each other. This allows the bitcell 100 to perform read, write, and erase operations without the need for a separate selection transistor. There are commonalities, however, between the dopings. In the illustrated N-type embodiment, both the source 102 and drain 104 include similar N+ dopings, having approximately $10^{20}$ cc/cm$^3$, where the N+ dopings extend at least partway under the oxide 112 and nitride layer 116. The source 102 also includes a similar source-drain extension (S/D) implant.

Regarding the differences between the dopings, the source 102 includes either a lightly doped drain (LDD) or a S/D extension implant that the drain does not include. The LDD and S/D extension implant are the same implant, the implant is called an LDD implant if the concentration of charge carriers is approximately $10^{19}$ cc/cm$^3$, whereas if the charge carrier concentration is approximately $10^{20}$ cc/cm$^3$ it is instead called a S/D extension implant due to the charge carrier concentration being similar to the source 102 and drain 104 regions. The LDD extends the source 102 underneath the portion of the nitride layer 116 adjacent to the source 102 as well as partway underneath gate In contrast to the source, the LDD implant or S/D extension implant is blocked on the drain 104 side of the bitcell, under the bar contact 120. By creating a gap between the gate 110 and the drain 104 a portion of the channel is gated by the spacer gate 106. By controlling a portion of the channel 108 with the floating gate spacer 106, the electrical characteristics of the device can be persistently changed by adding or removing charge from the spacer (106).

The substrate may be a silicon substrate or a silicon-on-insulator (SOI) type substrate. In one embodiment, the active region 130 is a p-type substrate. In another embodiment, the active region 130 is doped to include a P-well having approximately $10^{17}$ charge carriers (cc) per cubic centimeter (cm$^3$) in the channel region 108. Is other embodiments not shown a PMOS bitcell can be used.

Figure 1B:
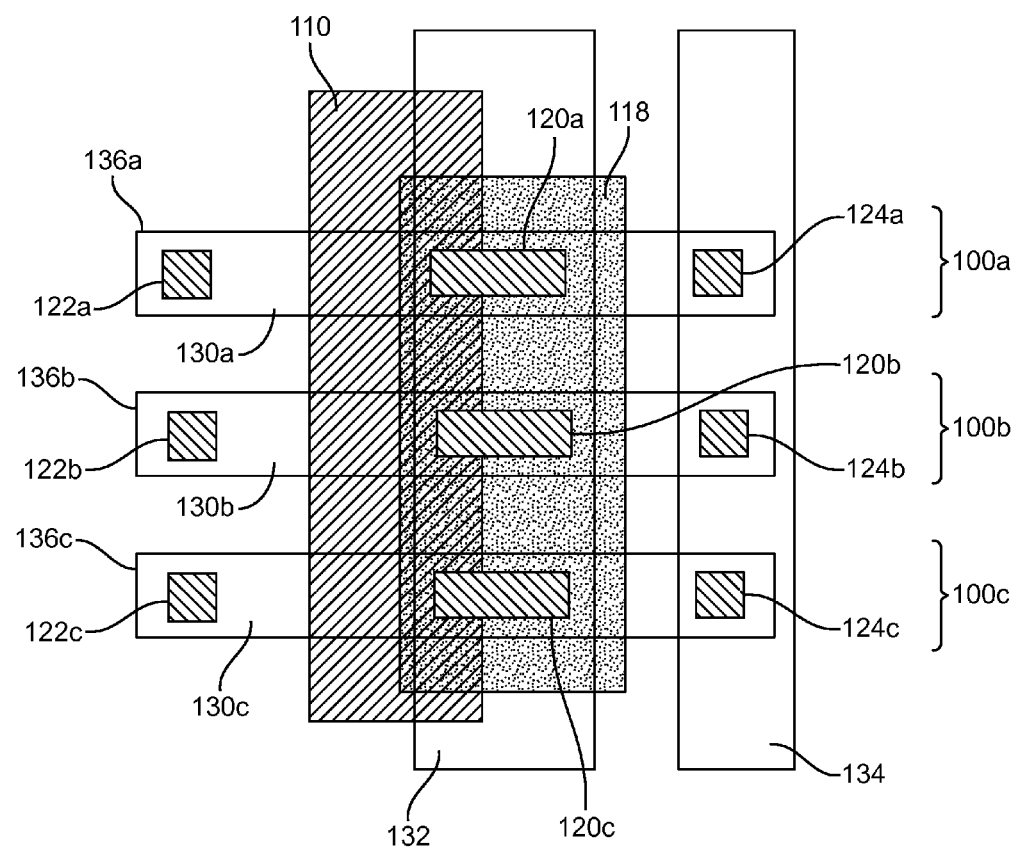
FIG. 1B is a top view of a number NVM bitcells including bar contacts, according to one embodiment.

FIG. 1B is a top view of a number of NVM bitcells including bar contacts 120a through 120c, according to one embodiment. In FIG. 1B, the active regions 130a-c of three different bitcells 100a-c are illustrated. Each bitcell includes a different source contact 122a-c and drain contact 124a-c. Each of the source contacts 122a-c is coupled to a different metal bit line 136a-c. The drain contacts 124a-c are all coupled to the same metal word line 134. The gate 110 and salicide block 118 extends across all of the bitcells 100a-c of the word line. The bar contacts 120a-c are all coupled to the same metal bar contact line 132.

In on embodiment, the bar contact 120 is narrower in width in a direction perpendicular to current flow in the channel region than a width of a diffusion (channel 108). In this embodiment, the bar contact encloses the spacer 106 in the direction of current flow (i.e., parallel to current flow). To ensure it encloses the spacer the bar contact may be shaped as a rectangle, extending slightly to either side of the spacer 106 in the direction of current flow. Typically, there are manufacturing process related limitations on the allowed shape of the bar contact, related to limitations in the photo process and the process of filling the contact hole. The bar contact does not necessarily have to be smaller than the channel 108 width perpendicular to current flow of the transistor. However, if the bar contact is coincident with the diffusion/channel 108, if there is also any misalignment the bar contact 120 will be partially over the channel 108 and partially not over the channel 108. Making the diffusion slightly larger in the perpendicular direction removes this issue as a potential source of variation in device performance. In an alternate embodiment where there are no process limitations on the shape of the bar contact, the bar contact may also be shaped similarly to 132.

In another embodiment, the floating gate may be implemented as a multigate transistor such as a Fin field effect transistor (or FinFET) (not shown). The FinFET differs from a normal FET in that the floating gate wraps around the channel region between the source and drain, creating a structure that looks like a "fin". In the same or a different embodiment, the substrate in which the active regions are formed may be a ultra-thin body silicon on insulator (UTB-SOI) having a thickness of approximately 5 nm. Such a design reduces short-channel effects and suppresses leakage by keeping gate capacitance in closer proximity to the whole of the channel. In some FINFET processes the silicon fin can be smaller than the contact. So, the bar contact might wrap around the fin, which is desirable.

Operation of the NVM Bitcell

The bitcell 100 is read by raising gate 110 (e.g., the select device) to a voltage that forms a channel under gate 110. Current will then flow from the source 102 to the drain 104 depending on how much charge is stored in the floating gate portion of the nitride portion of the spacer 106. The charge in the spacer (106) is set by using CHEI or CHISEL to program the floating gate 106. Programming causes electrons to be added to the floating gate 106, reducing its voltage and thus preventing the channel region 108 from turning on when the bitcell is read. In a P-type implementation, IHEI may instead be used to program the floating gate 106. In a PMOS bitcell the programming results in the bitcell being set to the higher current state during read. The bitcell uses BTBT to erase the floating gate 106. Erasing causes holes to be added to the floating gate 106, increasing its voltage and thus causing the channel region 108 to turn on when the bitcell is read. The logical state of the bitcell is read by applying a voltage differential between the source 102 and drain and applying some voltage to the gate 110. If current flows between the source 102 and drain 104 owing to a lack of electrons on the floating gate 106, the bitcell is considered to be in a first logical state. If current does not flow between the source 102 and the drain owing to a presence of sufficient electrons on the floating gate 106, the bitcell is considered to be in a second logical state. In another embodiment, both the gate and bar contact voltages are raised to read the bitcell.

Table 1 set forth below illustrates read, program, and erase operations and idle state for an example N-type bitcell 100.

TABLE 1

Bitcell 100 Operation

| Operation | Source 102/Bit Line 136 | Drain 104/ Word Line 134 | Gate 110 | Bar Contact 120 | Active Region 130 |
| --- | --- | --- | --- | --- | --- |
| Read | 0 V | 1 V | 3 V | 0 V | 0 V |
| Program (set to "off" state with CHEI) | 0 V | 6 V | 5 V | 7 V | 0 V |
| Erase (set to conducting "on" state with BTBT) | 0 V | $V_{BTBT}$ e.g., 6 V | ≤0 V | −3 V | 0 V |
| Idle | 0 V | 0 V | 0 V | 0 V | 0 V |

Figure 1C:
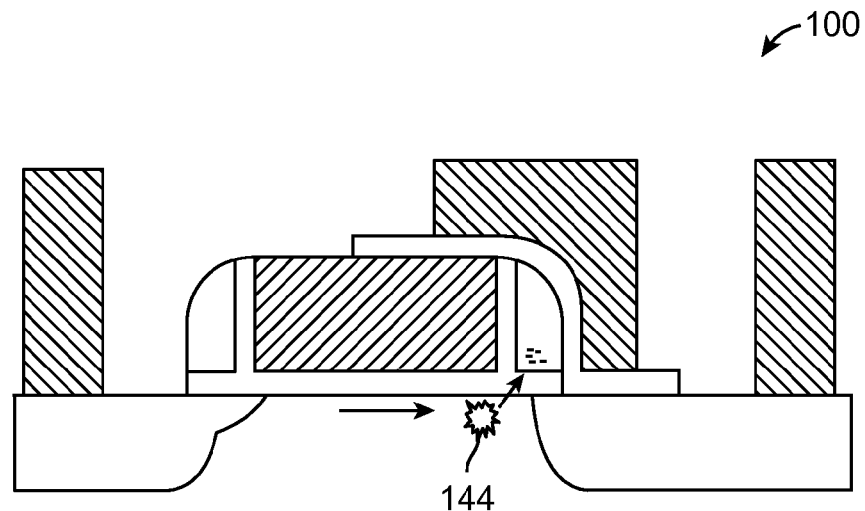
FIG. 1C is a cross sectional view of the NVM bitcell of FIG. 1A during a program operation, according to one embodiment.

FIG. 1C is a cross sectional view of the NVM bitcell of FIG. 1A during a program operation, according to one embodiment. To program bitcell 100, the source 102 is set to 0 Volts (V), the drain is set to 6V, the gate is set to 5 V, and the bar is set to 7 V. The voltage drop establishes a high intensity electric field between the source 102 and the drain 104 across the channel region 108. The electric field causes electrons 144 to accelerate from the source 102 towards the drain 104. Some of the electrons will have enough energy to be injected onto either the gate 110 or the floating gate 106. This process is referred to as channel hot electron injection (CHEI). Channel initiated secondary electron injection (CHISEL) and CHEI function similarly, with the exception that CHISEL uses secondary electrons instead of primary electrons.

Ordinarily, the direction the electrons would travel during CHEI or CHISEL would be random. However, due to the positive voltage on the bar contact 120, a vertical electric field is established between the negative electrons being ejected from the channel region 108 and the positive voltage at the bar contact 120. This difference in potential causes the ejected electrons to attempt to travel towards the bar contact 120 and lowers the barrier allowing electrons with lower energy to tunnel through the oxide 112. As the floating gate 106 is located between the channel region 108 and the bar contact 120, many more electrons reach the floating gate 106 than would absent the bar contact 120. Thus, the electric field established by the voltage on the bar contact 120 helps move electrons onto the floating gate 106.

Figure 1D:
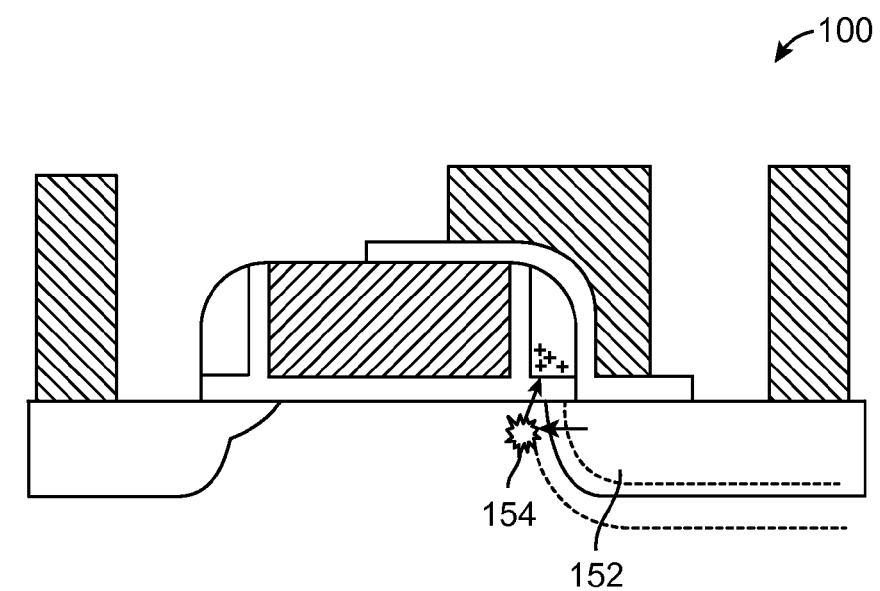
FIG. 1D is a cross sectional view of the NVM bitcell of FIG. 1A during an erase operation, according to one embodiment.

FIG. 1D is a cross sectional view of the NVM bitcell of FIG. 1A during an erase operation, according to one embodiment. To erase bitcell 100, the source is set to 0 V and the drain 104 is set to a voltage that induces band to band tunneling ($V_{BTBT}$), which may vary during the erase operation as the amount of charge on the floating gate 106 changes. In one embodiment, BTBT is induced at 6 V on the drain 104. The gate 110 is set to 0 V or less, and the bar contact is set to −3 V or less.

The high positive voltage $V_{BTBT}$ at the diode between the channel region 108 and the drain 104 causes any electron that tunnel through the depletion region to gain a lot of energy. If the highly energetic (hot) electron collides with an electron in the channel region 108 an energetic hole electron pair can be created. By placing a very low voltage on the bar contact 120, the hot holes are attracted to floating gate 106. If the holes have enough energy (hot enough) the holes can tunnel through the oxide 112 and become trapped in the floating gate. Low voltage on the bar contact 120 help lower the barrier for the holes to tunnel through the oxide 112.

Ordinarily, the direction the holes travel during BTBT would be random. However, due to the negative voltage on the bar contact 120 and the 0V or negative voltage on the floating gate 110, a vertical electric field is established between the positives holes tunneling from the channel region 108 and the negative voltage at the bar contact 120. This difference in potential causes the tunneling holes to attempt to travel towards the bar contact 120. As the floating gate 106 is located between the channel region 108 and the bar contact 120, many more holes reach the floating gate 106 than would absent the bar contact 120. Thus, the electric field established by the voltage on the bar contact 120 helps move holes onto the floating gate 106.

The programming and erasing operations of bitcell 100 are non-destructive to the oxide 112. As a result, bitcell 100 is a multiple time program (MTP) bitcell, as it can be programmed and erased many times.

To read the voltage on floating gate 106, the source 102 is set to 0 V, the drain is set to 1 V, the gate is set to 3 V, and the bar contact 120 is set to 0 V. An erased bitcell will have a significantly more positive voltage than a programmed bitcell. Under these voltages, an erased bitcell will be sufficiently positive to allow current to flow between the source 102 and the drain 104, whereas a programmed bitcell will not be sufficiently positive to allow current to flow between the source 102 and the drain 104.

Bar contacts can be used to similar effect in other types NVM bitcells that can also manufactured using the standard CMOS logic process. The following sections illustrate some other example bitcells that incorporate bar contacts.

Dual Gate NVM Bitcell with Bar Contact

Figure 2:
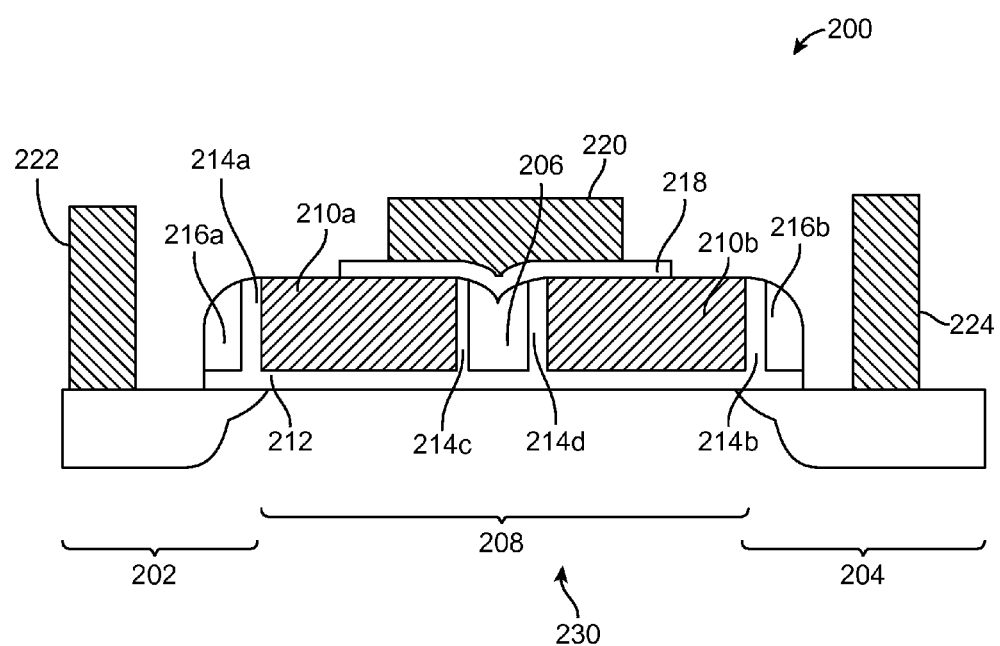
FIG. 2 is a cross sectional view of a dual gate NVM bitcell including a bar contact, according to one embodiment.

FIG. 2 is a cross section view of a dual gate NVM bitcell 200 including a bar contact 220, according to one embodiment. The bitcell 200 includes a source 202 and a drain 204, both of which include similar implants. The source 202 and drain 204 are separated by an active region 230, which may be an undoped P-type substrate or a P-well or a P-Well with additional doping added. The source 202 is connected to a source contact 222, and the drain 204 is connected to a drain contact 224. The implants forming the source 202 and drain 204 penetrate partway underneath an oxide 212 formed on an active region 230.

Two gates 210a and 210b are formed on the oxide 212. These gates 210 may be formed with polysilicon, metal, or a number of other materials. On either side of each gate 210a and 210b are spacers 214 which are adjacent to nitride layers 216. Along the cross section illustrated in FIG. 2, a first nitride layer 216a is located against a first sidewall 214a on the outside of the first gate 210a, and a second nitride layer 216b against a second sidewall 214b on the outside the second gate 210b.

The floating gate 206 of bitcell is the nitride layer formed between the gates 210a and 210b. Specifically, the floating gate 206 is located between two sidewall spacers 214c and 214d that surround those portions of the gates 210a and 210b. A salicide block 218 is located on top of the floating gate 206. The salicide block 218 may completely cover the floating gate 206, and also at least partially covers both of the gates 210. A bar contact 220 is formed to contact the top of the salicide block 218.

Bitcell 200 is programmed, read, and erased similarly to bitcell 100, with the extra gate 210b also capable of being set to a voltage to facilitate the operation being performed. The region 206 between the gates 210a and 210b is very small. The region 206 can be written or erased by (1) bringing the gates 210a and 210b to a high voltage, thereby capacitively coupling region 206 up to some portion of that voltage, and (2) bringing the bar contact 220 to a high voltage, establishing a high vertical electric field between the channel region 208 and the bar contract 220. Activation of the channel region 208 is controlled by controlling the voltages at the source 202 and drain. Due to differences in construction, different voltages may be applicable for programming, reading, and erasing the bitcell. Like bitcell 100, bitcell 200 is an MTP bitcell.

Manufacturing the NVM Bitcell Using the Standard CMOS Logic Process

FIGS. 6A-6H illustrate a process for manufacturing a NVM bitcell including a bar contact using a standard CMOS logic process, according to one embodiment. At the start of the CMOS logic process, a shallow trench isolation (STI) is formed (not shown). Well implants, such as a P-well implant, are then formed to create the active region 130. Threshold voltage adjustment implants that affect the turn-on voltage of the bitcell may also be added. Any other implants needed for the bitcell prior to the formation of the gate stack may also be added at this time.

Figure 6A:
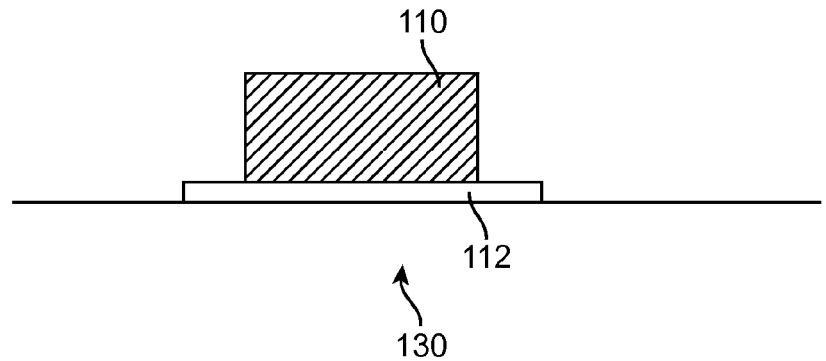
FIGS. 6A through 6H illustrate a process for manufacturing a NVM bitcell including a bar contact using a standard CMOS logic process, according to one embodiment.

To form the gate stack, in FIG. 6A an oxide 112 is formed on the active region 130. A gate 110 is formed on the oxide 112 by depositing a conductive material. The gate 110 is then etched to reduce the lateral extent of the gate 110 so that it is less than that of the oxide 112 over the active region 130.

Figure 6B:
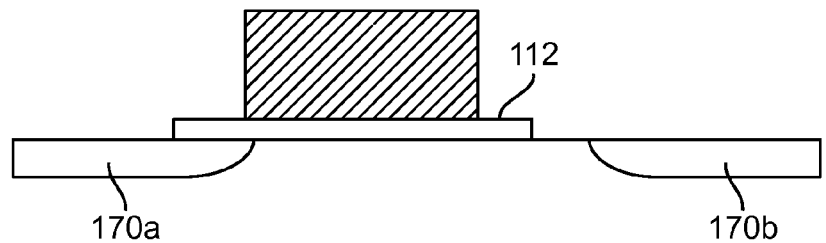

In FIG. 6B, charge carriers are implanted 170. In one embodiment, there are any combination of 4 implant operations, for example two 170 occurring earlier in the manufacturing process as illustrated in FIG. 6B: an input/output (I/O) N-LDD implant, an I/O P-LDD implant, and two 172 occurring later in the manufacturing process as illustrated in FIG. 6D: a low voltage (LV) N-S/D implant, and a LV P-S/D implant. In one embodiment, for an NMOS bitcell the LDD is N type, for PMOS bitcell the LDD is P type. In another embodiment, the LDD implant has a same polarity as the channel region and an opposite polarity to the source and drain. The gate 110 and photo resist (not shown) blocks a portion of the substrate during the implantation, so that the LDD implants 170 are self-aligned to the gate 110 on one side of the device and is offset some distance to the gate on the other side. However, some amount of lateral diffusion results in some of the LDD charge carriers partially penetrating underneath the oxide 112. Due to the difference in size of the oxide 112 on the source side and drain side of the bitcell, the LDD implant 170a on the source side of the bitcell extends partway underneath the gate 110, but not on the drain side 170b due to the lateral extent of the oxide 112 on the drain side.

The LDD implant 170 is performed with an initial photo mask and the S/D implant 172 is performed with a different photo mask. The LDD implant 170 is blocked on one side (e.g., the drain side) to allow for a gap between the gate 110 and S/D implant. The gap allows the charge on the floating gate 106 to control the threshold voltage $V_T$ on a portion of the channel of the bitcell. For example, based on the charge on floating gate, either an ordinary channel or a pinch-off channel will be created in the gap. The S/D implant 172 is implanted after the spacer is formed (see FIG. 6D). The S/D implant 172 is self-aligned to the gate+ spacer and typically does not extend all the way under the spacer.

The S/D implant 172 normally extends most of the way underneath where the spacer 116 will be formed. However, anytime an implant is done there is some lateral straggle (ions ricochet sideways). The lateral straggle typically causes and implant to go sideways ~⅔ of the depth of the implant. There are some process options to reduce this lateral straggle. The S/D implant 172 is typically implanted much deeper in the substrate than the LDD implant 170 since it is preferable if it is low resistance and implanted deeper than the salicide such that the salicide does not contact the silicon below the source/drain implant. This is because if the depletion region touches the salicide, the source/drain will experience very high leakage. However, thicker the salicide, the lower the resistance of the bitcell, and therefore the faster the device. Thus, a thick salicide is advantageous for bitcell performance. As described below, salicide is formed by putting a metal (e.g., cobalt) on silicon and heating it. Pulling silicon up from the substrate causes the salicide to be partially "recessed" down into the substrate. Thus, in order for the bitcell to prevent contact between the S/D implant and a thick salicide, the S/D implant must be deep enough so that the depletion region never touches the salicide in the "recessed" region.

Before or after the implants 170, gate oxidation and/or deposition may also be performed. If oxidation/deposition is performed before implantation, the oxidation/deposition serves to reduce source/drain to gate 110 overlap (e.g., parasitic capacitance) and protect the gate oxide 112. If oxidation/deposition is performed after implantation, the oxidation/deposition is used to anneal any damage caused to the gate oxide 112 during the LDD implant.

Figure 6C:
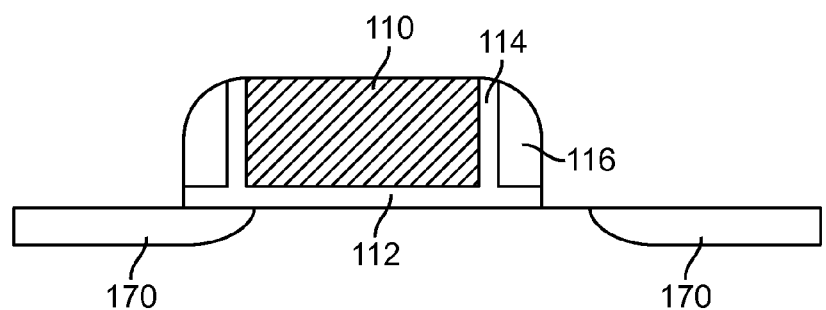
Figure 6D:
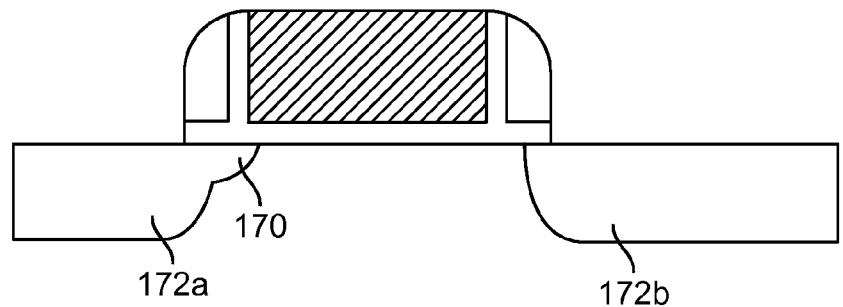

In FIG. 6C, the sidewall spacers 114 and nitride layer 116 are formed on either side of the gate 110. To form the sidewall spacers 114 and nitride layer 116, the oxide and nitride are deposited and then etched. The etch is stopped as soon as the etch clears the substrate 130 and gate 110. In one embodiment, this is accomplished using a blanket etch. The spacers 114 separate the source and drain from the channel region. The spacers 114 are also used to block salicide formation.

In FIG. 6D, N+ implants 172 are implanted in the source and drain. For an NMOS device, the S/D 172, LDD 170, and S/D extension 170 implants are all N type. In some embodiment, there is also a halo implant of p-type combined with the S/D extension implant 170. In an PMOS bitcell, the S/D 172, LDD 170, and S/D extension implants 170 are all P type. Again due to diffusion, some amount of the implanted charge carriers will extend partway underneath the oxide 112 and nitride layer 116. However, the charge carriers do not penetrate underneath gate 110 due to the type and angle of implantation.

Figure 6E:
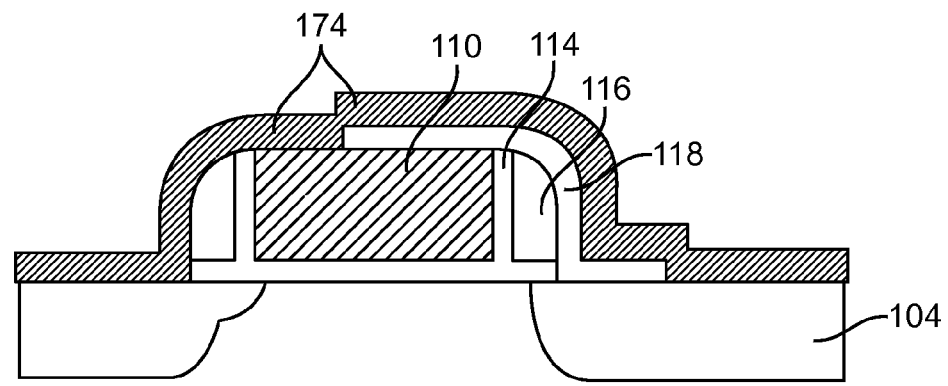

In FIG. 6E, a salicide block 118 is formed on the gate 110, one sidewall 114, that side's nitride layer 116 (the floating gate 106), and on at least a portion of the drain 104. In one embodiment, the salicide block 118 can be formed by depositing a dielectric and then performing a photo/etch. After the salicide block 118 has been deposited, a metal is deposited to begin the process of forming a salicide on unblocked portions of the bitcell. The metal may, for example, be Cobalt or Nickel. In one embodiment, the metal is added via sputtering, though in other embodiments other processes may be used.

Figure 6F:
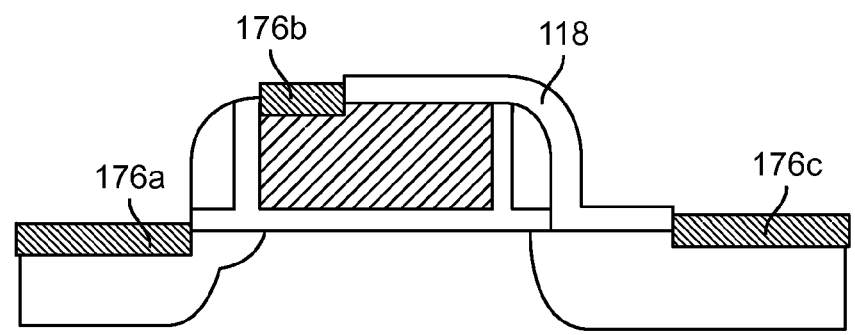

In FIG. 6F, the deposited metal is heated to form a self-aligned silicide (salicide) 176. For example, Cobalt become CoSi, Nickel becomes NiSi. The silicide is self-aligned because no masking processing is used to dictate the location of the silicide. Instead, either oxide ($SiO_2$) or nitride ($Si_3N_4$) or another dielectric blocks the formation of the salicide. As described above the salicide block 118 dictates where the silicide is formed on the bitcell 100. The heating is performed at a temperature sufficient to cause metal to combine with silicon to form the silicide, but not high enough for the metal to pull silicon out of $SiO_2$ or $Si_3N_4$. In one embodiment, the heating process is a rapid thermal anneal (RTA). Deposited metal that is only in contact with the salicide block 118 does not have any silicon to interact with, and thus remains as metal. The unconverted metal is then stripped, for example using an acid dip that removes pure metal but does not remove metal/silicon molecules. An additional heat step heats the salicide to form low resistance salicide. The salicide is formed as several separate portions, a first portion 176*a* on top of the source, 102, a second portion 176*b* on top of a portion of the gate 110, and a third portion 176*c* on top of the drain 104.

Figure 6G:
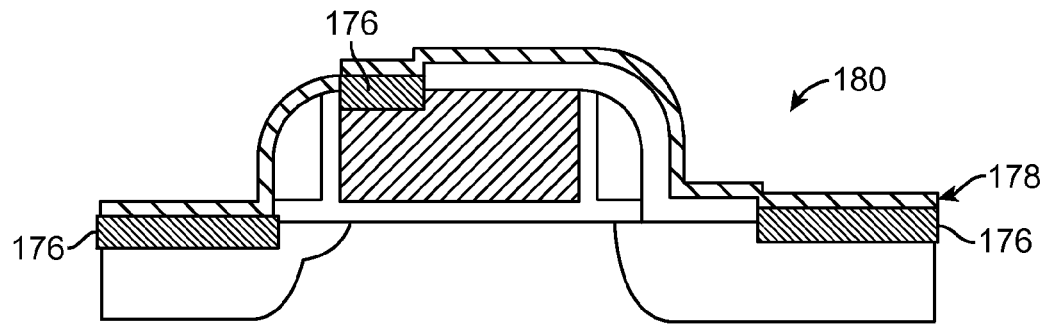

In FIG. 6G, an inter level dielectric (ILD) is added. To form the ILD, an etch stop layer 178 is deposited over the bitcell. Typically, the ESL 178 is made of nitride, though other materials may also be used. Oxide 180 is deposited on top of the ESL 178 in sufficient quantity to allow creation of a level top surface over the entirety of the bitcell 100. Chemical mechanical polishing (CMP) is then performed to flatten the top surface of the oxide 180.

Figure 6H:
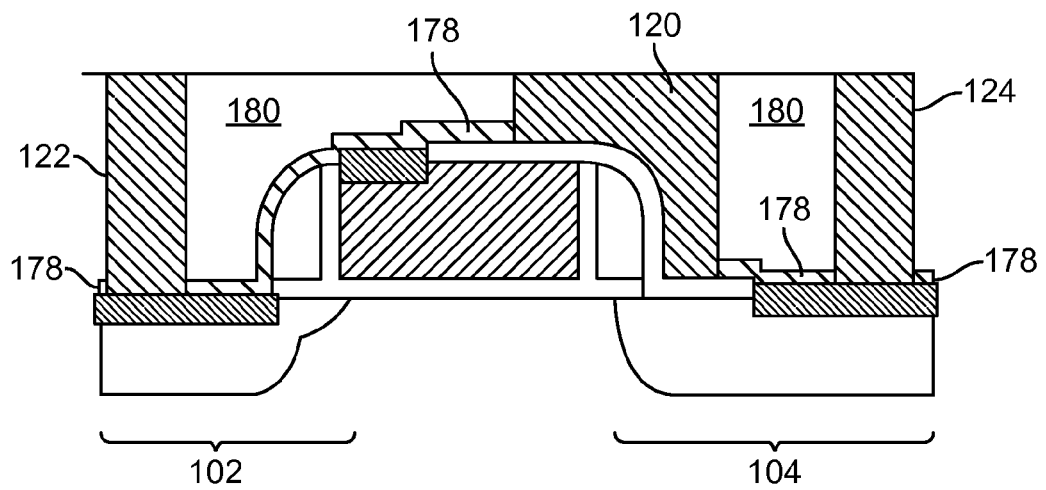

In FIG. 6H, a photo/etch process is performed to create the contact holes for the source contact 122, drain contact 124, and bar contact. Generally, an etch stop layer (ESL) 178 is used to avoid over etching during the photo/etch process. The ESL 178 beneath the oxide 180 allows for a two-step etch process. The first step etches oxide 180 very quickly and nitride 178 very slowly. This allows the etch to performed across the entirety of the bitcell simultaneously, despite the differing thickness of the oxide 180 above the gate stack versus above the source and drain 102. It also allows the etch to stop on portions of the wafer where the oxide 180 is thinner due to CMP doming across the wafer on which an array bitcells are formed.

The first step etch is patterned so as to remove oxide 180 to make a contact hole for each of the source contact 122, drain contact 124, and bar contact 120, but to leave the remaining oxide 180 in place. After these portions of oxide 180 have been removed to make the contact holes all the way down to the ESL 178, the etch chemistry is changed and the second etch step is performed. The chemistry of the second etch step etches nitride 178 quickly. The second etch is short in duration, and removes the remaining ESL 178 layer at the bottom of the spaces cleared by the first etch step.

The second etch step 178 is kept short in duration in the event that at the bottom of the ESL 178 is another layer of a dielectric that is not intended to be etched. For example, in bitcell 100 salicide block 118 may be formed of a dielectric such as nitride. As described above with respect to FIG. 1, the salicide block 118 is intentionally part of the bitcell 100 to ensure that the bar contact 120 is only capacitively and not directly electrically or physically connected to the gate 110 and nitride layer 116. By keeping the second etch step short, the second etch does not have time to also remove the salicide block 118 if it is made of nitride.

After the second etch step 178, the contact holes 122, 124, and 120 are filled with conductive material to form the contacts. Typically, the conductive material is added in more than one step. First, a liner material is added, then a glue or seed layer is added, and finally a tungsten or copper fill layer is added. Excess metal on the top of the wafer is removed with CMP.

Contacts are typically drawn in the database of the manufacturing computer as square shapes, as viewed from above the bitcell. However, manufacturing processes carrying out the CMOS logic process end up generally producing circle shapes, again as viewed from above the bitcell. A dot (or circle), such as is used to create the source contact 122 and drain contact 124 is a very difficult shape for a photolithographic process to create. To minimize the difficultly in printing a dot, generally only one size is of contact is allowed. As a result, the photolithographic process can be optimized to produce exactly that dot size to a high degree of accuracy and reproducibility.

However, the CMOS logic process contains one exception to this single size contact. A bar contact, which is rectangular, is allowed to be created on the die seal ring near the end of the CMOS logic process. The die seal ring is a continuous ring of metal formed using bar contacts and metal lines to form a diffusion barrier blocking mobile ions from penetrating into the dielectrics in the metal layer stack (one of which is shown as metal layer 1 in FIG. 1B) that are layered on top of the oxide 180. A die seal ring extends from the silicon surface of the wafer all the way to the last layer on the die, which in many instances is the passivation layer on the top of the bitcell. Thus, the die seal ring completely seals these dielectrics.

Bar contacts are typically not allowed inside the chip as part of the bitcell since they might have voids inside them and as a result because current carrying capability is not guaranteed. However, in bitcell 100, as bar contact 120 is used only as a capacitive top plate, it does not need to conduct current but merely hold a voltage. As a result, bar contact 120 is permitted in the standard CMOS logic process.

SONOS/SONOM NVM Bitcells with Bar Contact

Figure 3:
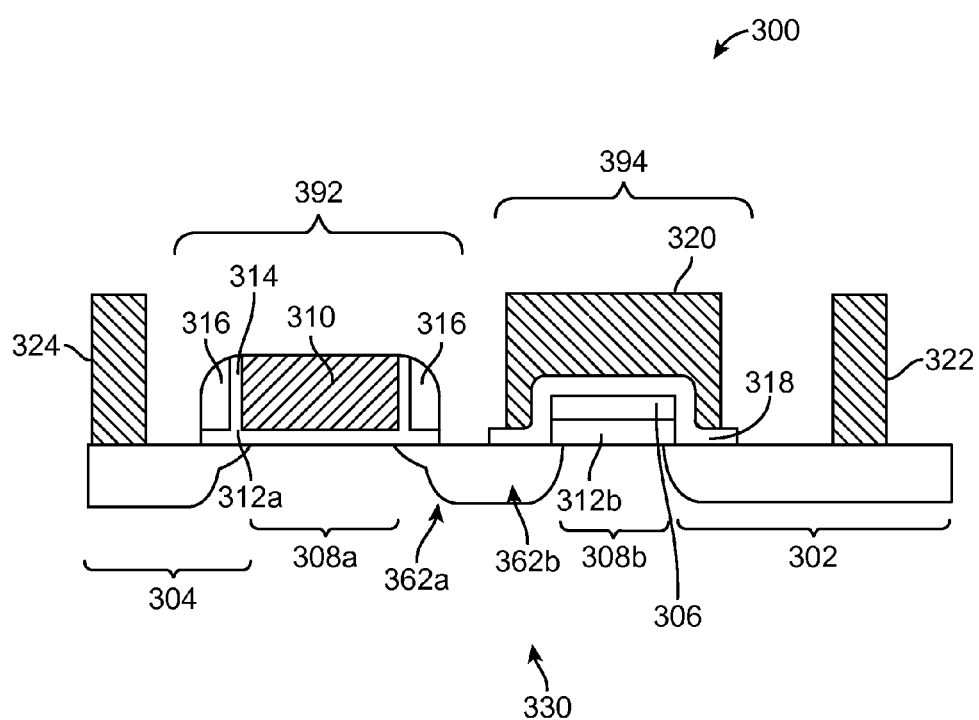
FIG. 3 is a cross sectional view of a SONOS/SONOM NVM bitcell including a bar contact, according to one embodiment.
Figure 4:
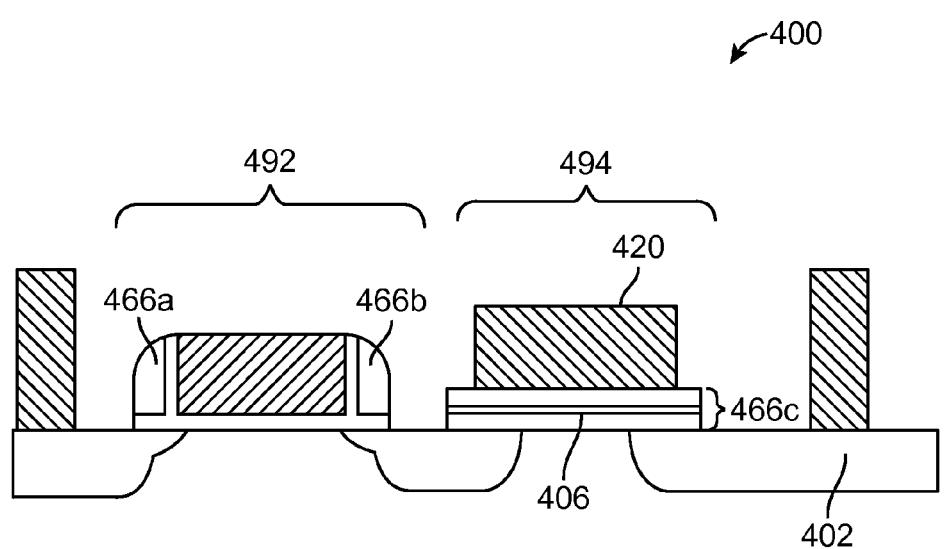
FIG. 4 is a cross sectional view of another SONOS/SONOM NVM bitcell including a bar contact, according to one embodiment.
Figure 5:
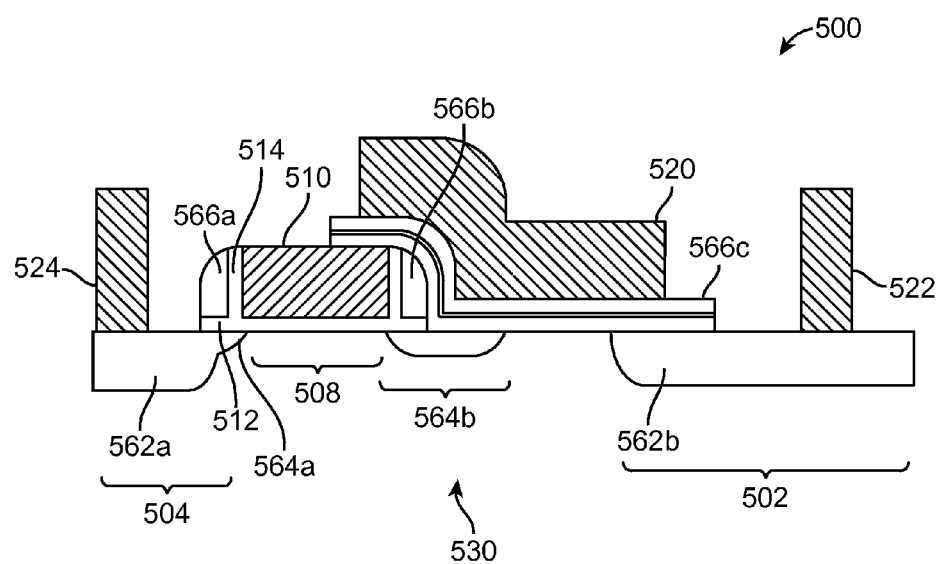
FIG. 5 is a cross sectional view of yet another SONOS/SONOM NVM bitcell including a bar contact, according to one embodiment.

The addition of the bar contact can also be used to make either a silicon-oxide-nitride-oxide-silicon (SONOS) or a silicon-oxide-nitride-oxide-metal (SONOM) bitcell. The bitcell operates as a not-OR (NOR) logical device. In one embodiment, this bitcell is manufactured by adding a single mask to the CMOS logic process. The additional mask allows for selective etching of a sidewall spacer that separates the nitride layer that acts as the floating gate from electrical contact with other parts of the bitcell. This allows the nitride layer to formed as an entirely separate physical structure on top of the substrate from the gate stack that assists with controlling which operation (program/erase/read) is performed. An example of such a SONOS/SONOM bitcell is illustrated in FIG. 3, described below. In another embodiment, in addition to the additional mask, the bitcell's composition is modified to replace the salicide block and nitride layer combination with an oxide-nitride-oxide (ONO) salicide block (or an oxide-nitride-oxide-nitride (ONON) salicide block). Two examples of such SONOS/SONOM bitcells are illustrated in FIGS. 4 and 5, both of which are described further below.

FIG. 3 is a cross sectional view of a SONOS/SONOM NVM bitcell 300 including a bar contact 320, according to one embodiment. The bitcell 300 includes a source 302 and a drain 304. The source 302 and drain 304 are in an active region 330, which may be an undoped P-type substrate or a P-well. The source 302 is connected to a source contact 322, and the drain 304 is connected to a drain contact 324.

The bitcell 300 includes two physically separate structures on top of the substrate. A first 392 of the structures includes a first oxide 312a, a gate 310, spacers 314, and a first nitride layer 316 formed on the first oxide 312a against the spacers 314 on either side of the gate 310. The second 394 of the structures includes a second oxide 312b, a second nitride layer that acts as the floating gate 306, a salicide block 318, and a bar contact 320. The second oxide 312b can be made up partially of the gate oxide (312a) and spacer oxide (316) or it can be entirely formed from spacer oxide 316. The bar contact 320 is sufficiently large that it at least partially overlaps the implants diffusing underneath the second oxide 312b on either side of the second structure 394. The second structure 394 is the SONOS/SONOM structure, for example, including silicon substrate 330, oxide layer 312b, nitride layer 306, oxide layer 318, and silicon/metal (bar contact 320). The salicide block layer can be oxide or nitride or a combination of the two.

The first 392 and second 394 structures of the bitcell 300 may each include different implants of charge carriers from each other. The drain 304 side of the first structure 392 also includes either a LDD or a S/D ext. implant that extends underneath the nitride layer 316 as well as partway underneath the gate 310. The drain 304 also includes an N+ doping that extends partway under nitride layer 316. The source side 362a of the first structure 392 includes similar dopings.

The source 302 side of the second structure 394 includes an N+ implant that s coextensive with a LDD or a S/D ext. implant, both of which diffuse partway underneath the floating gate 306 of the second structure 394. The drain side 362b of the second structure 394 includes similar dopings.

In one embodiment, bitcell 300 can be operated similarly to how a NOR (not-OR) Flash bitcell operates. In another embodiment, if a memory device: includes many structures identical to structure 394 in series with one contact gate 392, the device can be operated the same way a NAND (not-AND) Flash bitcell operates. Both NAN and NOR Flash cells may use Fowler-Nordheim (FN) tunneling to erase the bitcell, and CHEI and CHISEL to program it.

FIG. 4 is a cross sectional view of another SONOS/SONOM NVM bitcell 400 including a bar contact 420, according to one embodiment. Bitcell 400 is structurally similar to bitcell 300 except the NVM floating gate is formed purely from the salicide block. The salicide dielectric is specifically engineered to be an ONO stack. This salicide block 466c is located on the left of the first structure 492 labeled 466c in the second structure 494. The middle nitride layer of the ONO salicide block 466c is the floating gate 406 of the bitcell 400. 466a and 466b are spacers used by the CMOS logic devices. In place of the ONO salicide block 466, the bitcell 400 may instead form these layers as an oxide-nitride-oxide-nitride (ONON) salicide block (not shown), with the extra nitride layer being located in contact with the bar contact 420. This extra nitride layer performs a protective function, acting as a second etch stop layer, further ensuring that the etch of the oxide above ONON layer (not shown) does not accidentally over-etch into the floating gate 406.

In manufacturing bitcell 400, the charge carrier implants under the second structure 494 are not self-aligned as they are in bitcell 300. In bitcell 300, the charge carrier implants are self-aligned under the second structure 494 because the second oxide 312b is added prior to implantation. In contrast, in bitcell 400, the charge carrier implants are added prior to the ONO salicide block 466, and thus they have nothing to align to. Using an ONO stack adds flexibility to the manufacturing process of the bitcell, as the ONO stack can be added in between many different steps in the process, each of which results in the implant being self-aligned.

The bar contact 420 is sufficiently large that it at least partially overlaps the implants underneath the ONO salicide block 466c. In order to avoid a short of the bar contact 420 to the active region 430, the ONO salicide block 466c is generally formed sufficiently large so as to overlap the lateral extent of the bar contact 420 over the active region 430. However, in some implementations some amount of shorting between the bar contact 420 and source 402 may be acceptable.

When forming bitcell 400, forming the ONO salicide block 466a, 466b may result in the salicide block 466a, 466b overlapping the gate 410. Such a configuration may also be used to manufacture a functional bitcell, as illustrated in bitcell 500 shown in FIG. 5.

FIG. 5 is a cross sectional view of yet another SONOS/SONOM NVM bitcell 500 including a bar contact 520, according to one embodiment. The bitcell 500 includes a source 502 and a drain 504. The source 502 and drain 504 are separated by an active region 530, which may be an undoped P-type substrate or a P-well. The source 502 is connected to a source contact 522, and the drain 504 is connected to a drain contact 524.

Bitcell 500 includes a single structure on top of the substrate, similar to bitcell 100. An oxide layer 512, a gate 510, and spacers 514, are formed on the substrate. An ONO salicide block 566*c* is formed on either side of the spacers 514, as well as on top on the gate 510, spacers 514, as well as a portion of the substrate. A bar contact 520 is then formed on top of a portion of the ONO salicide block 566*c*.

For charge carrier implants, bitcell 500 includes LDD implants (or S/D ext. implants) 564*a-b* on either side of oxide 512. Bitcell 500 also includes N+ implants 562*a-b*. One of the N+ implants 562*a* makes up the drain 504 along with one of the LDD implants 564*a*. The source drain N+ implant is self-aligned with oxide 512. The LDD implant 564*a* is self-aligned to the gate 510. The other N+ implant 562*b* makes up the source 502. However, this N+ implant 562*b* is not self-aligned, as it is formed prior to the addition of ONO salicide block 566*c*. Additionally N+ implant 562*b* is electrically and physically separated from the LDD implant 564*b* located in between the source 502 and the drain 504. The left side of implant 564*b* is self-aligned to gate 510. The right side of implant 564*b* is defined by a photo resist edge. It is not self-aligned.

As a consequence of the bitcell's 500 structure, even though bitcell 500 consists of only a single structure formed on the surface of the active region 530, the presence of LDD implant 564*b* causes it to operate similarly to bitcells 300 and 400 which contain two separate structures on the surface of their respective active regions. Specifically, in bitcell 500 the SONOS/SONOM structure is made up of silicon substrate 530, an oxide layer 566*c*, a nitride layer 566*c*, another oxide layer 566*c*, and silicon/metal (bar contact 520).

Overview of Electronic Design Automation Design Flow

Figure 7:
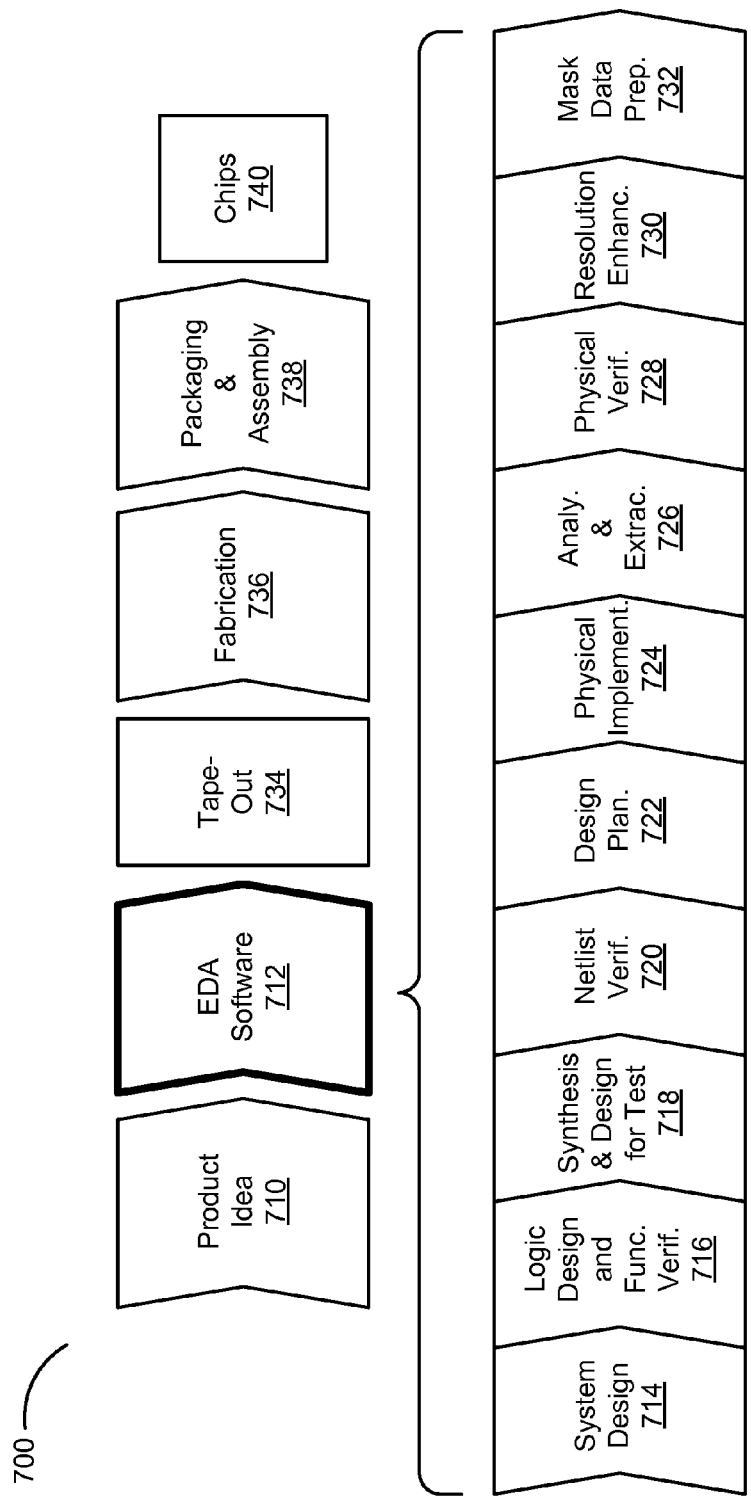
FIG. 7 is a flowchart illustrating the various operations in the design and fabrication of an integrated circuit such including the NVM bitcell, according to one embodiment.

FIG. 7 is a flowchart illustrating the various operations in the design and fabrication of an integrated circuit such including the NVM bitcell, according to one embodiment. This process starts with the generation of a product idea 710, which is realized during a design process that uses electronic design automation (EDA) software 712. When the design is finalized, it can be taped-out 734. After tape-out, a semiconductor die is fabricated 736 to form the various objects (e.g., a bitcell including gates, metal lines, vias) in the integrated circuit design. Packaging and assembly processes 738 are performed, which result in finished chips 740.

The EDA software 712 may be implemented in one or more computing devices including a memory. An example of a memory is a non-transitory computer readable storage medium. For example, the EDA software 712 is stored as instructions in the computer-readable storage medium which are executed by a processor for performing operations 714-732 of the design flow, which are described below. This design flow description is for illustration purposes. In particular, this description is not meant to limit the present disclosure. For example, an actual integrated circuit design may require a designer to perform the design operations in a difference sequence than the sequence described herein.

A cell library incorporating one or more NVM bitcells or circuits as described above may be stored in the memory. The cell library may be referenced by the EDA software 712 to create a circuit or electronic device incorporating the NVM bitcells or circuits.

During system design 714, designers describe the functionality to implement. They can also perform what-if planning to refine the functionality and to check costs. Note that hardware-software architecture partitioning can occur at this stage. During logic design and functional verification 716, VHDL or Verilog code for modules in the circuit is written and the design is checked for functional accuracy. More specifically, the design is checked to ensure that it produces the correct outputs. During synthesis and design for test 718, VHDL/Verilog is translated to a netlist. This netlist can be optimized for the target technology. Additionally, tests can be designed and implemented to check the finished chips. During netlist verification 720, the netlist is checked for compliance with timing constraints and for correspondence with the VHDL/Verilog source code.

During design planning 722, an overall floor plan for the chip is constructed and analyzed for timing and top-level routing. Example EDA software products from Synopsys, Inc. of Mountain View, Calif. that can be used at this stage include: Astro® and IC Compiler® products. During physical implementation 724, the placement (positioning of circuit elements) and routing (connection of the same) occurs. During analysis and extraction 726, the circuit function is verified at a transistor level, which permits refinement. During physical verification 728, the design is checked to ensure correctness for: manufacturing, electrical issues, lithographic issues, and circuitry. During resolution enhancement 730, geometric manipulations of the layout are performed to improve manufacturability of the design. During mask-data preparation 732, the 'tape-out' data for production of masks to produce finished chips is provided.

Embodiments of the present disclosure can be used during one or more of the above-described stages. Specifically, in some embodiments the present disclosure can be used in EDA software 712 that includes operations between design planning 722 and physical implementation 224.

ADDITIONAL CONSIDERATIONS

Upon reading this disclosure, a reader will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A non-volatile memory bitcell comprising:
 a source and a drain formed in an active region and separated by a channel region in the active region;
 a gate stack comprising:
  a gate formed on an oxide over the channel region;
  at least one sidewall spacer formed around the gate; and
  a charge trapping layer formed on an opposite side of the sidewall spacer from the gate, at least a portion of the charge trapping layer acting as a floating gate of the bitcell;
 an electrically insulating layer covering the floating gate portion of the charge trapping layer; and
 a contact physically contacting the electrically insulating layer above the floating gate portion of the charge trapping layer, wherein the contact does not make direct electrical contact to either the gate or the active region.

2. The non-volatile memory bitcell of claim 1, wherein the contact comprises a rectangular shape.

3. The non-volatile memory bitcell of claim 1, wherein the electrically insulating layer is a salicide block.

4. The non-volatile memory bitcell of claim 1, wherein the contact comprises a metal.

5. The non-volatile memory bitcell of claim 1, wherein the contact is narrower in width in a direction perpendicular to current flow in the channel region than a width of a diffusion.

6. The non-volatile memory bitcell of claim 1, wherein the charge trapping layer comprises a nitride.

7. The non-volatile memory bitcell of claim 1, further comprising:
a salicide layer formed on the source, the drain, and a portion of the gate not covered by the salicide block.

8. The non-volatile memory bitcell of claim 1, further comprising:
an etch stop layer formed over the gate stack and the active region; and
an oxide formed on the etch stop layer, and
wherein the contact penetrates the oxide and the etch stop layer and contacting the salicide block above the portion of the charge trapping layer acting as a floating gate of the bitcell.

9. The non-volatile memory bitcell of claim 8, further comprising:
a source contact penetrating the oxide and the etch stop layer and contacting the source;
a drain contact penetrating the oxide and the etch stop layer and contacting the drain.

10. The non-volatile memory bitcell of claim 1, wherein the source comprises at least one lightly doped drain (LDD) implant or a source-drain (S/D) extension implant that extends partway underneath the gate.

11. The non-volatile memory bitcell of claim 1, wherein the bitcell does not include an LDD implant, an N+ or P+ implant, or a S/D extension implant under the charge trapping layer of the bitcell.

12. The non-volatile memory bitcell of claim 1, where the channel region extends beyond the gate to at least partially under the charge trapping layer in the spacer.

13. The non-volatile memory bitcell of claim 1, further comprising:
an LDD implant in the active region below the charge trapping layer, the LDD implant having a same polarity as the channel region and an opposite polarity to the source and drain.

14. A non-transitory machine readable medium storing instructions, that when operated by a processor of a manufacturing facility apparatus, cause the apparatus to manufacture a non-volatile memory bitcell that comprises:
a source and a drain formed in an active region and separated by a channel region in the active region;
a gate stack comprising:
a gate formed on an oxide over the channel region;
at least one sidewall spacer formed around the gate; and
a charge trapping layer formed on an opposite side of the sidewall spacer from the gate, at least a portion of the charge trapping layer acting as a floating gate of the bitcell;
an electrically insulating layer covering the floating gate portion of the charge trapping layer; and
a contact physically contacting the electrically insulating layer above the floating gate portion of the charge trapping layer, wherein the contact does not make direct electrical contact to either the gate or the active region.

15. The non-transitory machine readable medium of claim 14, wherein the contact comprises a rectangular shape.

16. The non-transitory machine readable medium of claim 14, wherein the electrically insulating layer is a salicide block.

17. The non-transitory machine readable medium of claim 14, wherein the contact comprises a metal.

18. The non-transitory machine readable medium of claim 14, wherein the contact is narrower in width in a direction perpendicular to current flow in the channel region than a width of a diffusion.

19. The non-transitory machine readable medium of claim 14, wherein the charge trapping layer comprises a nitride.

20. The non-transitory machine readable medium of claim 14, wherein the non-volatile memory bitcell further comprises:
a salicide layer formed on the source, the drain, and a portion of the gate not covered by the salicide block.

21. The non-transitory machine readable medium of claim 14, wherein the non-volatile memory bitcell further comprises:
an etch stop layer formed over the gate stack and the active region; and
an oxide formed on the etch stop layer, and
wherein the contact penetrates the oxide and the etch stop layer and contacting the salicide block above the portion of the charge trapping layer acting as a floating gate of the bitcell.

22. The non-transitory machine readable medium of claim 21, wherein the non-volatile memory bitcell further comprises:
a source contact penetrating the oxide and the etch stop layer and contacting the source;
a drain contact penetrating the oxide and the etch stop layer and contacting the drain.

23. The non-transitory machine readable medium of claim 14, wherein the source comprises at least one lightly doped drain (LDD) implant or a source-drain (S/D) extension implant that extends partway underneath the gate.

24. The non-transitory machine readable medium of claim 14, wherein the bitcell does not include an LDD implant, an N+ or P+ implant, or a S/D extension implant under the charge trapping layer of the bitcell.

25. The non-transitory machine readable medium of claim 14, where the channel region extends beyond the gate to at least partially under the charge trapping layer in the spacer.

26. The non-transitory machine readable medium of claim 14, wherein the non-volatile memory bitcell further comprises:
an LDD implant in the active region below the charge trapping layer, the LDD implant having a same polarity as the channel region and an opposite polarity to the source and drain.

* * * * *